(12) United States Patent
Thiel et al.

(10) Patent No.: US 9,937,664 B2
(45) Date of Patent: Apr. 10, 2018

(54) METHOD FOR PRODUCING A THREE-DIMENSIONAL STRUCTURE

(71) Applicant: Nanoscribe GmbH, Eggenstein-Leopoldshafen (DE)

(72) Inventors: Michael Thiel, Karlsruhe (DE); Roman Reinhard Reiner, Karlsruhe (DE); Fabian Niesler, Karlsruhe (DE); Yann Tanguy, Linkenheim-Hochstetten (DE)

(73) Assignee: Nanoscribe GmbH, Eggenstein-Leopoldshafen (DE)

( * ) Notice: Subject to any disclaimer, the term of this patent is extended or adjusted under 35 U.S.C. 154(b) by 316 days.

(21) Appl. No.: 14/869,377

(22) Filed: Sep. 29, 2015

(65) Prior Publication Data
US 2016/0114530 A1    Apr. 28, 2016

(30) Foreign Application Priority Data
Oct. 22, 2014   (DE) .......................... 10 2014 221 480

(51) Int. Cl.
*B29C 71/02* (2006.01)
*B29C 71/04* (2006.01)
(Continued)

(52) U.S. Cl.
CPC ...... *B29C 67/0066* (2013.01); *B29C 33/3842* (2013.01); *B29C 35/0805* (2013.01);
(Continued)

(58) Field of Classification Search
CPC . B29C 33/3842; B29C 35/08; B29C 35/0805; B29C 2035/0827; B29C 2035/0833; B29C 2035/0838; B29C 64/10; B29C 64/124; B29C 64/129; B29C 64/135; B29C 64/141; B29C 64/153;
(Continued)

(56) References Cited

U.S. PATENT DOCUMENTS

| 4,575,330 A | 3/1986 | Hull |
| 6,364,986 B1 * | 4/2002 | Kieronski .............. B33Y 10/00 264/401 X |

FOREIGN PATENT DOCUMENTS

DE        19507881        9/1995

OTHER PUBLICATIONS

Ma, Weiyin et al., "NURBS-Based Adaptive Slicing for Efficient Rapid Prototyping," Computer-Aided Design 36, accepted Feb. 2, 2004, pp. 1309-1325.
(Continued)

*Primary Examiner* — Leo B Tentoni
(74) *Attorney, Agent, or Firm* — Ware, Fressola, Maguire & Barber LLP

(57) ABSTRACT

A method for producing a three-dimensional structure (10) in a lithographic material (24) that can be polymerized and thus solidified using energy input methods, wherein initially a shell wall (16) of the three-dimensional structure (10) to be produced is polymerized so as to form a polymerized shell wall (16) such that a volume (28) of unpolymerized lithographic material is enclosed using a first, spatially resolving energy input method, wherein the lithographic material (24) surrounding the polymerized shell wall (16) is removed in an intermediate development step, wherein subsequently the volume (28) enclosed by the shell wall (16) is polymerized using a second energy input method.

18 Claims, 4 Drawing Sheets

(51) Int. Cl.
  B29C 67/00    (2017.01)
  B29C 64/124   (2017.01)
  B29C 64/282   (2017.01)
  B29C 64/40    (2017.01)
  B29C 64/141   (2017.01)
  B29C 64/277   (2017.01)
  B29C 64/10    (2017.01)
  B29C 33/38    (2006.01)
  B29C 64/295   (2017.01)
  B29C 64/153   (2017.01)
  B29C 64/129   (2017.01)
  B29C 35/08    (2006.01)
  G03F 7/00     (2006.01)
  G03F 7/20     (2006.01)
  B29C 64/135   (2017.01)
  B33Y 10/00    (2015.01)
  B29K 105/00   (2006.01)
  B29L 9/00     (2006.01)

(52) U.S. Cl.
  CPC ............ *B29C 64/10* (2017.08); *B29C 64/124* (2017.08); *B29C 64/129* (2017.08); *B29C 64/135* (2017.08); *B29C 64/141* (2017.08); *B29C 64/153* (2017.08); *B29C 64/277* (2017.08); *B29C 64/282* (2017.08); *B29C 64/295* (2017.08); *B29C 64/40* (2017.08); *G03F 7/0037* (2013.01); *G03F 7/2024* (2013.01); *G03F 7/2053* (2013.01); *G03F 7/70416* (2013.01); *B29C 2035/0827* (2013.01); *B29C 2035/0833* (2013.01); *B29C 2035/0838* (2013.01); *B29K 2105/0058* (2013.01); *B29L 2009/00* (2013.01); *B33Y 10/00* (2014.12)

(58) Field of Classification Search
  CPC ... B29C 64/277; B29C 64/282; B29C 64/295; B29C 64/40; B29C 71/02; B29C 71/04; B33Y 10/00; B33Y 40/00; G03F 7/70416
  USPC ....... 264/219, 236, 259, 308, 401, 494, 496, 264/497
  See application file for complete search history.

(56) References Cited

OTHER PUBLICATIONS

Rosa, L. et al., "Optoplasmonics: Hybridization in 3D," Micro/Nano Materials, Devices and Systems, Proceeding of SPIE, vol. 8923, Dec. 7, 2013, 7 pages total.

European Patent Office Search Report issued in counterpart EP patent application No. 15180364.0 dated Jan. 27, 2016, 8 pages total.

Malinauskas, M. et al.: "Femtosecond laser fabrication of hybrid micro-optional elements and their integration on the fiber tip", Proceedings of SPIE, vol. 7716, pp. 77160A-1 to 77160A-12 (2010).

Sabourin, E. et al.: "Accuracte exterior, fast interior layered manufacturing", Rapid Prototyping Journal, vol. 3, No. 2, pp. 44 to 52 (1997).

Abstract of DE 195 07 881 B4 in English Language, (dated Sep. 14, 1995).

* cited by examiner

METHOD FOR PRODUCING A THREE-DIMENSIONAL STRUCTURE

BACKGROUND OF THE INVENTION

1. Field of the Invention

The invention relates to a method for producing a three-dimensional structure in a lithographic material.

Such lithographic methods are used, for example, when producing prototypes or workpieces with special shape requirements. In particular, such methods are used to produce micro or nanostructures, e.g. For experimental purposes and in areas in which great freedom of design is desired. Applications include, for example, the production of moldable topographies, templates, or dies for mass replication, the production of light guides, and the production of fitted prostheses for medical applications.

2. Description of Related Art

Among the known methods are various methods of so-called stereolithography (e.g. from U.S. Pat. No. 4,575,330 A1), wherein the desired structure is built up in layers in a bath of fluid lithographic materials, in particular photopolymer, by targeted exposure to a writing beam. The writing beam polymerizes a film at the surface of the bath of lithographic material into a desired pattern by local exposure. The structure is built up in layers by gradually lowering the substrate into the bath of lithographic material. It is also known (e.g. from DE 195 07 881 B4) that the layered structure can be provided with additional support structures, which are also produced in the lithographic material and typically extend outside the structure to support the structure on the substrate. Such support structures prevent a collapse of the unfinished structure.

SUMMARY OF THE INVENTION

While the methods mentioned above allow the production of structures with great freedom of design and high precision, they may take a considerable process time, especially if large-volume contingent structures are to be produced. This problem occurs in particular if the desired structure includes both large-volume sections and areas with small structure sizes. If a high spatial resolution is required due to the small structuring, the production of the large-volume areas will result in a considerably longer process time.

It is therefore the object of this invention to facilitate the production of structures with a high degree of freedom of design and as short a process time as possible while ensuring high precision and shape accuracy of the structure produced.

This object is achieved by a method according to the present invention. The desired three-dimensional structure is produced in a lithographic material which can be polymerized and in this way solidified or cured by means of energy input methods (e.g. irradiation, heating). The lithographic material is preferably fluid, viscous, paste-like, or solid in its unpolymerized state. For example, a lithographic varnish, especially a negative varnish, can be used. According to the method, a shell wall of the structure to be produced is defined using a first spatially resolving energy input method (i.e. the lithographic material is polymerized in a spatially resolved manner) such that the shell wall encloses a volume of unpolymerized lithographic material. An intermediate development step follows in which lithographic material surrounding the polymerized shell wall is at least partially removed. Then the volume of lithographic material that is enclosed in the shell wall is polymerized, i.e. solidified or cured, using a second energy input method.

This means that, starting from the unpolymerized original state, a volume of lithographic material is first separated from the surrounding lithographic material by the shell wall. An energy input method is selected for this purpose with which the shell wall can be produced in the required spatial resolution. The shell wall defines the desired structure in the surrounding lithographic material. In the intermediate development step, the surrounding lithographic material is removed at least partially, preferably completely.

This means that only the shell wall is written with the high spatial resolution of the first method. When the enclosed lithographic material is polymerized and solidified, energy input can be without a high spatial resolution. This saves considerable process time. In particular, it is not necessary that large-volume sections are written with the time-consuming spatially resolving energy input method. The dimensions of the produced structural features (walls, support structures, etc.) can for example be on the nanoscale (<10e−1 μm), microscale (10e−1-10e+2 μm), and on the mesoscale (10e+2-10e+4 μm). The produced volumes are not limited in principle and can be <1 cubic centimeter in typical applications.

The method according to the invention ensures high spatial resolution despite the clearly shortened process time since the enclosing shell wall is produced with the first spatially resolving energy input method. This permits rapid prototyping with shorter process times.

In principle, it is conceivable that the enclosed volume has a different degree of polymerization and/or other mechanical properties and/or other optical properties than the surrounding shell environment. In this way, the structures can be produced with different mechanical and optical properties. In addition, an exterior support structure is not absolutely necessary. In the method for a layered building of structures in the lithographic material explained at the outset, such exterior support structures have the function, inter alia, to fixate the layered structure as it develops in the bath of lithographic material and to prevent that sections of the unfinished structure float away, which is prevented when a shell structure is built.

The second energy input method is preferably different from the first energy input method. In particular, the second energy input method can be designed as a method without spatial resolution and/or acting on the entire unpolymerized lithographic material enclosed in the shell wall. The first energy input method can thus have a high spatial resolution, which is many times higher than the spatial resolution of the second energy input method. For example, the second energy input method can be a heating method, a baking method, or a curing method. For example, the structure with the polymerized shell wall can be placed in an oven, e.g. a convection oven or tubular furnace, or it can be brought into contact with a heating device (e.g. heating plate). An energy input method using microwave radiation, infrared radiation, UV radiation is also conceivable.

In contrast, the lithographic material is preferably polymerized in a spatially confined and movable focus area of a writing beam from a radiation source in the first spatially resolving energy input method. It is also conceivable to parallelize the method, wherein multiple focus areas of multiple writing beams are used, which can form a spatially resolved exposure pattern. The first energy input method can for example be a laser lithography or electron beam lithography, in particular a 3D laser lithography. While defining the structure using a writing beam is time-consuming, it yields highly precise structures. Since only the shell wall is defined, structuring time can still be kept short.

Polymerization of the lithographic material in the first energy input method is preferably achieved by two-photon absorption or multi-photon absorption in the focal area of the writing beam. The lithographic material is in particular configured, and the radiation source is in particular adjusted to the lithographic material such that polymerization can only be achieved either by two-photon or by multi-photon absorption. For example, such a long wavelength of the writing beam (and thus such a low photon energy) can be selected that the energy input required for polymerization is only achieved by simultaneous absorption of two or more photons. The probability of such an absorption process is dependent on intensity and considerably increased in the focal area as compared to the other writing area. According to fundamental considerations, the probability that two or more photons are absorbed can require that the radiation intensity is squared or raised to a higher power. In contrast, the probability of absorbing one photon has a different intensity dependence. There is also always attenuation involved when the writing beam penetrates the lithographic material. For example, Beer's law of intensity decrease as a function of penetration depth into the lithographic material can apply. The consequence is that spatially resolving polymerization in a focal area deep under the surface of the lithographic material using one-photon absorption would be problematic because, due to attenuation, the intensity in the focal area is not necessarily the highest when the focus is below the surface. In the stereolithographic methods described above, the structure is built in layers by just exposing the lithographic material on the surface of the bath of lithographic material. When two-photon or multi-photon absorption is used, such layered lowering of the structure into a bath of lithographic material is not absolutely necessary because polymerization can be limited to a focal area of a writing beam even at a larger penetration depth due to other laws.

In a preferred embodiment, a support structure disposed inside the shell wall is defined, i.e. polymerized, using a first, spatially resolving energy input method, preferably together with the shell wall. The support structure is in particular disposed inside the volume enclosed by the shell wall and may divide it into partial volumes. It can also be beneficial if the support structure is defined at a slight overlap with the shell wall, such that elements of the support structure slightly overlap with the shell wall and are firmly connected to it. The support structure in particularly includes support elements which extend between sections of the shell wall and/or between sections of the shell wall and a substrate. The support structure makes it possible to maintain the shape accuracy of the shape defined by the shell wall. In particular, it can be prevented that the structure defined by the shell wall in the intermediate step is deformed or collapses during the second energy input method or in a curing step. Overall, it can be ensured that the shape obtained matches the shape predetermined by the shell wall after the enclosed volume is cured.

Unlike known structuring methods with exterior support structures, there is no need to remove an interior support structure after the desired structure is finished. This saves process time for finishing the structure after curing the inside volume. Furthermore, an exterior support structure typically becomes a waste product after its removal, which can result in undesirable cost increases when expensive lithographic materials are used and is prevented by the interior support structure.

The design of the support structure also permits setting and influencing the mechanical properties of the desired structure. For example, suitable support structures can be used to produce an elastic core in the shell wall. It is conceivable to influence the elasticity of the desired structure. The support structure may for example be designed as a framework, a 3D honeycomb grid, a cubic grid, and/or an arrangement of struts or walls extending between sections of the shell wall.

The shell wall is preferably a shell wall that completely encloses a volume. However, it is also conceivable that the lithographic material is deposited on a substrate and that a section of the substrate surface encloses the volume of unpolymerized lithographic material together with the shell wall. The substrate can in principle be of any type, e.g. a glass or semiconductor wafer, a ceramic part, or a molded body. The substrate surface is thus used as a part of the enclosure of the enclosed volume. Then the shell wall does not have to enclose the volume completely and does not need to be produced in the first energy input step. This saves more time, since the substrate forms a part of the enclosure of the enclosed volume.

The intermediate development step is preferably designed such that the volume of unpolymerized lithographic material enclosed by the shell wall remains largely unaffected, especially uncured and/or undissolved. The intermediate development step can for example be a wet chemical development step and in particular designed for causing detachment of the lithographic material that surrounds the shell wall. A bath in a developing medium is conceivable, for example.

It is preferred that a lithographic material is used that can be photopolymerized and thermopolymerized. A photopolymerizable material is, for example, a light-curing synthetic material which can be polymerized using a writing beam of light, UV, or the like in the first energy input method. A thermopolymerizable lithographic material is, for example, a material which makes the transition to the polymerized state when heated above a threshold temperature. The second energy input method is then preferably a heating process. Also conceivable is the use of just a photopolymerizable material, wherein the first energy input method is a spatially resolved irradiation process and the second energy input method is a large-volume irradiation, e.g. a UV curing process.

The material wall can be provided with wall sections of different thicknesses. Mechanical properties of the material wall can be set in this way. It is also conceivable that only such wall sections are configured with a great wall thickness that have to have a high stability, e.g. to prevent the shell wall from collapsing during the intermediate development step.

For the further development of the method, it is conceivable that an additional hardening process of the shell wall is added after the intermediate development step and/or an additional hardening process is added after polymerization with the second energy input method. The additional hardening process may include a curing step and/or a chemical treatment in a hardener bath.

In principle, an upstream data processing step using software can be added in which data representing the structure to be produced (e.g. CAD data) is provided and then the software determines one dataset assigned to at least on shell, such that said shell together with the enclosed volume will yield the desired structure. A device for performing the first energy input method (e.g. a 3D laser lithograph) can then be operated accordingly using said dataset.

The shell wall may be composed of partial walls in structures with large-volume sections. The shell wall is defined by sequentially producing a plurality of partial walls, wherein a writing area of a device for performing the spatially resolving energy input method is sequentially moved and positioned for writing the partial walls, and wherein one partial wall is defined, i.e. polymerized, in said writing area.

For this purpose, the software can divide the data representing the structure can into partial sets representing the partial walls in a data processing step, e.g. in a so-called splitting process. A device for performing the spatially resolving energy input method (e.g. a 3D laser lithograph) can then be operated accordingly using said dataset.

In principle, the writing area is predetermined by the technical specifications of the energy input device or exposing device and in particular includes that area in which the writing beam can be directed with the required spatial resolution. Producing the shell wall of composite partial walls is especially beneficial if the spatially resolving energy input method is performed using a device that has a relatively small writing area compared to the size of the structure to be produced.

BRIEF DESCRIPTION OF THE DRAWING

The invention is explained in greater detail with reference to the figures below.

Wherein.

The same reference symbols were used for identical or corresponding features in the following description and the figures.

DETAILED DESCRIPTION OF THE BEST MODE OF THE INVENTION

Figure 1:
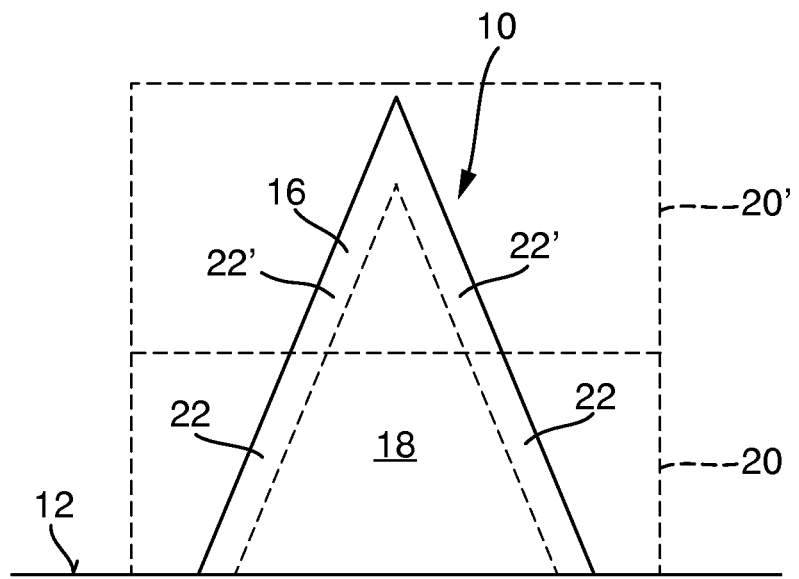
FIG. 1 shows an outline view of a structure to be produced to explain the production method.

First, the composition of a first exemplary three-dimensional structure will be described with reference to FIGS. 1 to 4.

The software is used to provide data (such as CAD data) that represents a structure 10 to be produced. As an example, a pyramidal structure 10 was selected, which is to be produced on the surface 12 of a substrate 14 using a three-dimensional prototyping method. The software splits the data that represents the structure 10 into a shell wall 16 and a volume section 18 of the structure 10 that is disposed inside said shell wall 16. In the example shown, the volume section 18 is delimited on the outside by the shell wall 16 on the one hand, and by the surface 12 of the substrate 14 to be fully enclosed on the other hand. Structures 10 are conceivable which are completely delimited on the outside by a shell wall 16 and/or not arranged on a substrate.

The software divides the structure 10 further into the partial areas 20, 20', which are directly adjacent and in particular cover the structure 10 completely or without an overlap. A slight overlap can be beneficial depending on the application and/or the precision of the tools used. Each partial section 20, 20' includes partial walls 22, 22' of the shell wall 16 such that the partial walls 22, 22' make up the complete shell wall 16 (especially without an overlap) if the partial sections 20, 20' are put together.

The actual production of the structure 10 represented by the data from FIG. 1 will be described below with reference to FIGS. 2 to 4. A substrate 14 is placed, for example, in a bath of lithographic material 24 which fills the space above the surface 12 of the substrate 14 (see FIG. 2). The lithographic material 24 may for example be a liquid or viscous synthetic varnish that can be both photopolymerized and thermopolymerized. In this respect, the lithographic material 24 can be polymerized and solidified in a controlled manner using energy input methods. Photopolymerization is performed, for example, using a first, spatially resolving energy input method through which polymerization can be caused in a focal area of a writing beam. Thermopolymerization can be performed, for example, using a second energy input method, as explained below.

To produce the structure 10, the spatially resolving first energy input method (e.g. photopolymerization in a spatially movable focal area of a writing beam) is used just to polymerize and solidify the shell wall 16 in the lithographic material 24.

Since the writing area of devices that produce a spatially resolved energy input is often limited due to precision requirements, the detailed structure is written subsequently in the partial areas 20, 20'. In particular, the partial areas 20, 20' are each selected to be positioned within the writing area 26 of the device for the first, spatially resolving energy input (e.g. a laser lithograph).

Figure 2:
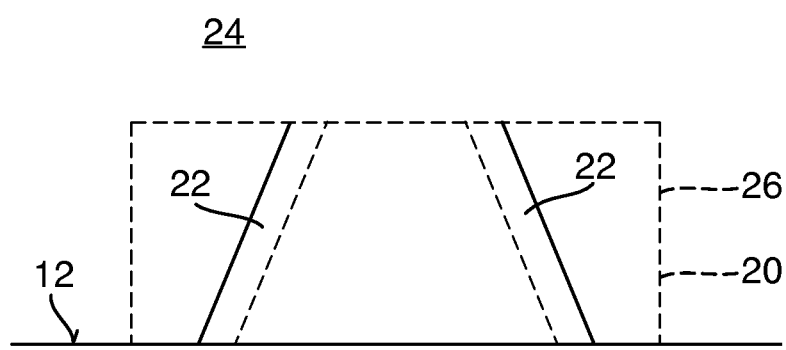
FIGS. 2 to 4 show outline views illustrating the production steps of the structure according to FIG. 1.
Figure 3:
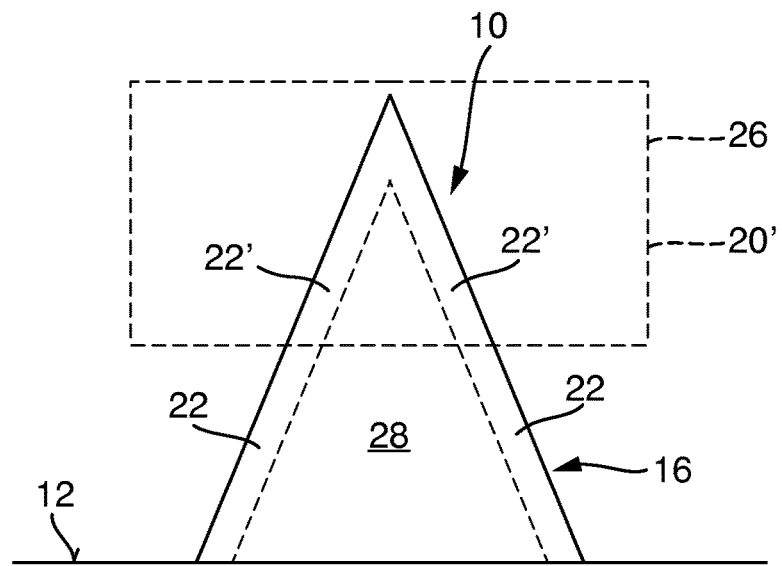

As shown in FIG. 2, the writing area 26 for the first resolving energy input method is positioned on the first partial area 20 of the structure 10, and the partial walls 22 of the first partial area 20 are written. In the next step, the writing area 26 is positioned over another partial area 20' of the structure 10 and the partial walls 22' are written, i.e. polymerized and solidified. The partial walls 22, 22' combine completely into the shell wall 16. The shell wall 16 and, in the example shown, the surface 12 of the substrate 14 thus enclose a volume 28 of unpolymerized lithographic material. This is because the selected first energy input method for producing the shell wall 16 has a high spatial resolution and only polymerizes the shell wall 16 in a controlled manner. The enclosed volume 28 corresponds to the volume section 18 of the structure 10.

The lithographic material surrounding the shell wall 16 can be removed in an intermediate development step, for example, in a developing medium, to solidify the enclosed volume 28 as well and thus create a lasting structure 10.

The structure consisting of the shell wall 16 and the enclosed but not yet polymerized volume 28 which is revealed in this way can then be moved to a device for performing the second energy input method. The second energy input method does not need to have a high spatial resolution. Instead, it is conceivable that the second energy input method acts globally on the entire structure enclosed by the shell wall 16. For example, the substrate 14 with the shell wall 16 and the enclosed volume 28 can be heated in an oven. Energy input using the second energy input method will then also polymerize and solidify the enclosed volume 28.

Figure 4:
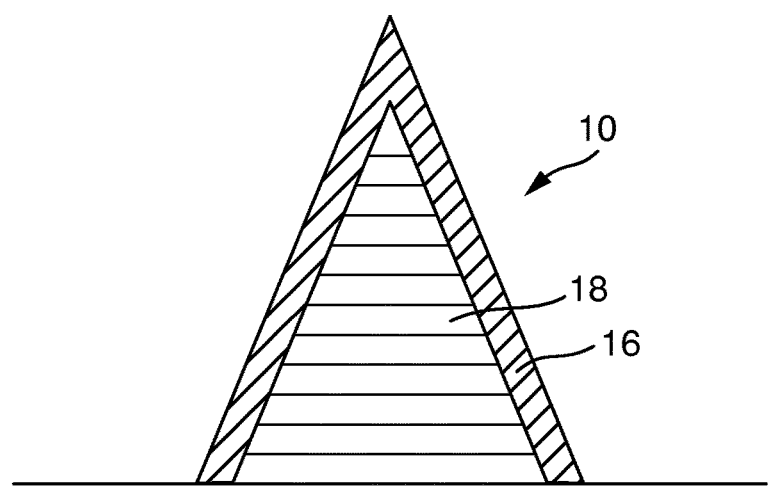

As FIG. 4 illustrates, the design of the second energy input method can influence the curing characteristics of the volume 28 and create a volume section 18 in the interior of the shell wall 16, wherein the physical properties of the volume section 18 deviate from the shell wall 16, for example. But it is also conceivable that the second energy input method is designed such that after curing the volume 28 a homogeneous structure 10 is created which is composed of the shell wall 16 and the volume section 18 enclosed therein, wherein the shell wall 16 and volume section 18 have the same structural and/or physical properties.

Figure 5:
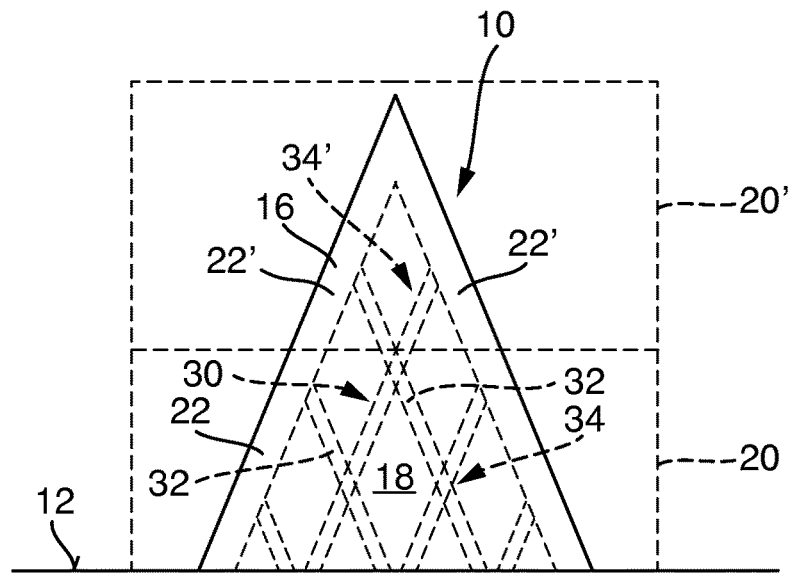
FIG. 5 shows an outline view explaining the production procedure for a structure with other design features.

Another embodiment of the production method is explained with reference to FIGS. 5 and 6. FIG. 5 once again illustrates the preparation of the data representing the structure 10. The structure 10 is once again divided into a shell wall 16 and an enclosed volume section 18. Furthermore, a support structure 30 which comprises a plurality of support elements 32 and is located inside the shell wall 16 is defined. In the example shown, the support elements 32 extend between sections of the shell wall 16 and the surface 12 of the substrate 14. In addition or alternatively, support elements may be provided that only extend between sections of the shell wall. This is an option if the volume section is only enclosed by shell walls 16 and none of the boundaries of volume section 18 is defined by the surface 12 of the substrate 14.

To meet the requirement of a limited size of the writing area for the first energy input method, the structure 10 can once again be split into several partial areas 20, 20', which again include partial walls 22, 22' that combine into the shell wall 16. The partial areas 20, 20' then also contain the partial sections 34, 34' of the support structure 30, and the entire support structure 30 is produced by combining the partial areas 20, 20'.

Figure 6:
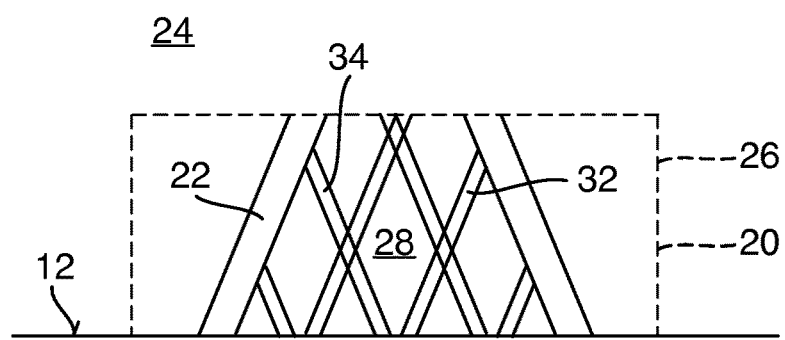
FIG. 6 shows an outline view explaining an intermediate step in the production of the structure according to FIG. 5.

FIG. 6 is used to explain the actual production of the structure 10 for which the substrate 14 is placed in a bath of lithographic material 24, for example. In a first step, the writing area 26 is positioned over the first partial area 20 of the structure 10, and the partial walls 22 of the shell wall 16 and partial sections 34 of the support structure 30 are polymerized using the spatially resolving first energy input method. In a subsequent step, the writing area 26 is positioned over another partial area 20' of the structure 10 and the remaining partial walls and partial elements of the support structure are written. The shell wall 16 and, optionally, the surface 12 of the substrate 14 thus enclose a volume 28 of unpolymerized lithographic material 24. In this case, the unpolymerized volume 28 is interspersed with solidified support elements 32 of the support structure 30. Since the support elements 32 in the example shown extend between the sections of the shell wall 16 and the substrate surface 12, the support elements 32 prevent the shell wall 16 from collapsing, e.g. in a subsequent intermediate development step. In alternative embodiments, the support elements 32, which extend between sections of the shell wall 16, can prevent portions of the shell wall 16 from being deformed or floating away.

In subsequent process steps, a second energy input method which does not need to have a precise spatial resolution is used to polymerize the enclosed volume 28. Material can be removed as may be required in an intermediate development step. By setting the parameters for the second energy input method, the volume 28 can have other physical and/or mechanical properties than the support structure 30. This is how the mechanical properties of the structure 10 can be set. It is also conceivable that the second energy input method is selected such that a completely homogeneous structure is obtained in the interior of the shell wall.

Figure 7:
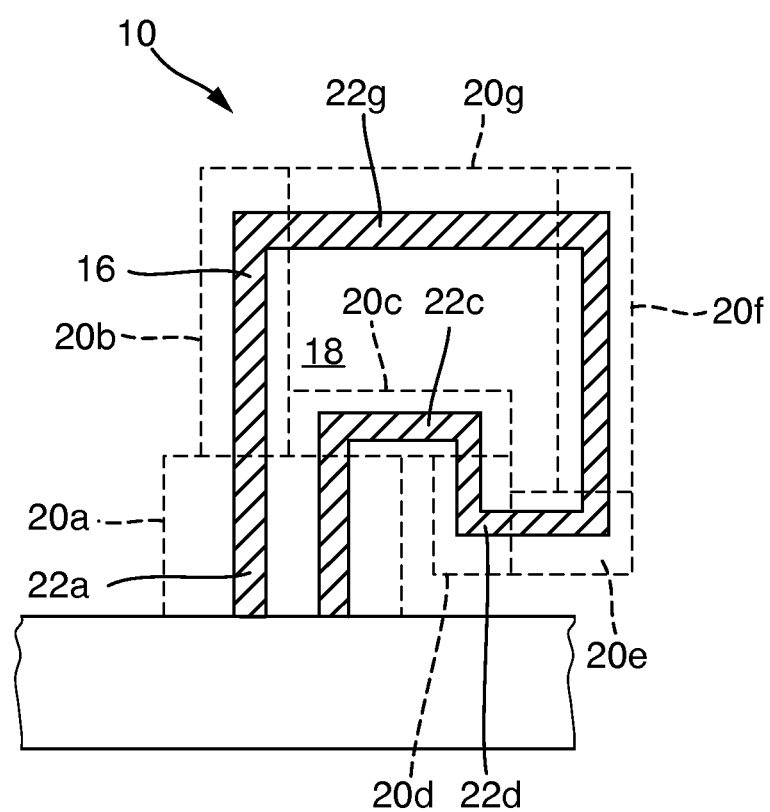
FIG. 7 shows an outline view explaining the production procedure for a more complex structure.

The preparation of data representing a more complex structure 10 for performing the production method is described with reference to FIG. 7. The structure 10 is once again divided into a shell wall 16 and a volume section 18 enclosed therein. In addition, the structure is divided into a plurality of partial areas 20a, 20b, 20c, 20d, 20e, 20f, 20g. These partial areas 20a to 20g each contain partial walls 22a, 22b, ..., only some examples of which were given reference symbols for the sake of clarity. In addition, it is conceivable that the partial areas 20a to 20g contain support structures with support elements that extend between sections of the shell wall 16 and/or between sections of the shell wall 16 and a substrate surface 12 (not shown).

For producing the structure 10, once again the partial areas 20a to 20g are written sequentially one after the other and the partial walls 22 and any support elements or sections of the support structure contained therein are written. The sequence of processing the partial areas may in particular be such that deformation or shifting of sections already written is prevented during the writing of a subsequent partial area. In the example shown, the partial areas 20a, 20b, 20c, 20d, 20e, 20f, 20g are preferably in the sequence given here. This will prevent that a partial area 20g written before with the partial wall 22g solidified therein is not yet supported by other partial walls and sinks into the bath of lithographic material. It is also conceivable that the shell wall 16 has wall sections with different thicknesses in the various partial areas 20a to 20g. For example, partial walls can be designed thicker in partial areas which have to carry a higher load of the structure 10 (e.g. the partial walls 22d and 22c in partial areas 20d and 20c).

THE SCOPE OF THE INVENTION

It should be understood that, unless stated otherwise herein, any of the features, characteristics, alternatives or modifications described regarding a particular embodiment herein may also be applied, used, or incorporated with any other embodiment described herein. Also, the drawings herein are not drawn to scale.

Although the invention has been described and illustrated with respect to exemplary embodiments thereof, the foregoing and various other additions and omissions may be made therein and thereto without departing from the spirit and scope of the present invention.

The invention claimed is:

1. A method for producing a three-dimensional structure (10) in a lithographic material (24), wherein the lithographic material (24) is configured to be polymerizable and thus solidified using energy input methods, wherein initially a shell wall (16) of the three-dimensional structure (10) to be produced is polymerized so as to form a polymerized shell wall (16) such that a volume (28) of unpolymerized lithographic material is enclosed using a first, spatially resolving energy input method, wherein the lithographic material (24) surrounding the polymerized shell wall (16) is removed in an intermediate development step, wherein subsequently the volume (28) enclosed by the shell wall (16) is polymerized using a second energy input method,
wherein the shell wall (16) of the structure (10) to be produced is defined by sequentially producing a plurality of partial walls (22, 22'; 22a-22g),
wherein a writing area (26) is sequentially moved and positioned for defining the partial walls (22, 22'; 22a-22g), and wherein a partial wall (22, 22'; 22a-22g) is defined in the writing area (26).

2. The method according to claim 1, characterized in that the second energy input method is different from the first, spatially resolving energy input method, including where the second energy input method is without spatial resolution and/or where the second energy input method acts on the entire unpolymerized lithographic material enclosed in the shell wall (16).

3. The method according to claim 1, characterized in that in the first, spatially resolving energy input method the polymerization of the lithographic material takes place in a spatially movable focal area of a writing beam of a radiation source.

4. The method according to claim 3, characterized in that the polymerization of the lithographic material is achieved by two-photon absorption or multi-photon absorption in the focal area of the writing beam.

5. The method according to claim 1, characterized in that the first, spatially resolving energy input method is further used to define a support structure (30) located inside the shell wall (16), including where the support structure includes support elements that extend between sections of the shell wall (16).

6. The method according to claim 1, characterized in that the lithographic material is deposited on a substrate (14) and that a section of the surface (12) of the substrate (14) encloses the volume (28) of unpolymerized lithographic material together with the shell wall (16).

7. The method according to claim 1, characterized in that the intermediate development step leaves the volume (28) of unpolymerized lithographic material enclosed in the shell wall (16) unaffected.

8. The method according to claim 1, characterized in that the lithographic material (24) used is configured to be photopolymerizable and/or thermopolymerizable.

9. The method according to claim 1, characterized in that the shell wall (16) includes several wall sections (22a-22g) with different wall thicknesses.

10. The method according to claim 2, characterized in that in the first, spatially resolving energy input method the polymerization of the lithographic material takes place in a spatially movable focal area of a writing beam of a radiation source.

11. The method according to claim 2, characterized in that the first, spatially resolving energy input method is further used to define a support structure (30) located inside the shell wall (16), including where the support structure includes support elements that extend between sections of the shell wall (16).

12. The method according to claim 2, characterized in that the lithographic material is deposited on a substrate (14) and that a section of the surface (12) of the substrate (14) encloses the volume (28) of unpolymerized lithographic material together with the shell wall (16).

13. The method according to claim 2, characterized in that the intermediate development step leaves the volume (28) of unpolymerized lithographic material enclosed in the shell wall (16) unaffected.

14. The method according to claim 2, characterized in that the lithographic material (24) used is configured to be photopolymerizable and/or thermopolymerizable.

15. The method according to claim 2, characterized in that the shell wall (16) includes several wall sections (22a-22g) with different wall thicknesses.

16. The method according to claim 3, characterized in that the first, spatially resolving energy input method is further used to define a support structure (30) located inside the shell wall (16), including where the support structure includes support elements that extend between sections of the shell wall (16).

17. The method according to claim 3, characterized in that the lithographic material is deposited on a substrate (14) and that a section of the surface (12) of the substrate (14) encloses the volume (28) of unpolymerized lithographic material together with the shell wall (16).

18. The method according to claim 3, characterized in that the intermediate development step leaves the volume (28) of unpolymerized lithographic material enclosed in the shell wall (16) unaffected.

* * * * *